United States Patent
Shindou et al.

(10) Patent No.: US 8,506,718 B2
(45) Date of Patent: Aug. 13, 2013

(54) POLYMER REMOVING APPARATUS AND METHOD

(75) Inventors: Takehiro Shindou, Nirasaki (JP); Masaki Kondo, Nirasaki (JP)

(73) Assignee: Tokyo Electron Limited, Tokyo (JP)

(*) Notice: Subject to any disclaimer, the term of this patent is extended or adjusted under 35 U.S.C. 154(b) by 261 days.

(21) Appl. No.: 12/857,938

(22) Filed: Aug. 17, 2010

(65) Prior Publication Data

US 2011/0041874 A1 Feb. 24, 2011

Related U.S. Application Data

(60) Provisional application No. 61/242,646, filed on Sep. 15, 2009.

(30) Foreign Application Priority Data

Aug. 18, 2009 (JP) .................. 2009-189105

(51) Int. Cl.
   *B08B 5/00* (2006.01)
(52) U.S. Cl.
   USPC ............... 134/1.3; 134/19; 134/21; 134/37; 134/105; 134/149; 216/58; 216/63; 216/64; 216/65
(58) Field of Classification Search
   None
   See application file for complete search history.

(56) References Cited

U.S. PATENT DOCUMENTS

| | | | |
|---|---|---|---|
| 2008/0073324 A1* | 3/2008 | Nogami et al. | 216/58 |
| 2009/0143894 A1 | 6/2009 | Sakuragi et al. | |

FOREIGN PATENT DOCUMENTS

| | | |
|---|---|---|
| JP | 2006-49869 A | 2/2006 |
| JP | 2006-229075 | 8/2006 |
| JP | 2007-311768 A | 11/2007 |
| JP | 2008-270748 A | 11/2008 |
| JP | 2009-123831 | 6/2009 |

OTHER PUBLICATIONS

Machine Translation of JP2006-229075 by Watanabe et al., published Aug. 31, 2006.*

* cited by examiner

*Primary Examiner* — Michael Barr
*Assistant Examiner* — Ryan Coleman
(74) *Attorney, Agent, or Firm* — Rothwell, Figg, Ernst & Manbeck, P.C.

(57) ABSTRACT

A polymer removing apparatus for use in removing polymer annularly adhered to a peripheral portion of a target substrate includes a processing chamber for accommodating the target substrate having the polymer annularly adhered to the peripheral portion thereof; a mounting table for mounting the target substrate thereon; and a laser irradiation unit for irradiating ring-shaped laser light at once to the whole polymer annularly adhered to the target substrate. The polymer removing apparatus further includes an ozone gas supply unit for supplying an ozone gas to the polymer annularly adhered to the target substrate and a gas exhaust unit for exhausting the ozone gas.

14 Claims, 4 Drawing Sheets

POLYMER REMOVING APPARATUS AND METHOD

CROSS-REFERENCE TO RELATED APPLICATIONS

This application claims priority to Japanese Patent Application No. 2009-189105 filed on Aug. 18, 2009, and U.S. Provisional Application No. 61/242,646 filed on Sep. 15, 2009 the entire contents of which are incorporated herein by reference.

FIELD OF THE INVENTION

The present invention relates to a polymer removing apparatus and method for removing polymers annularly adhered to a peripheral portion of a substrate.

BACKGROUND OF THE INVENTION

In the manufacture of semiconductor integrated circuits, plasma etching is performed on a target substrate such as a semiconductor wafer. During the plasma etching, radicals and ions generated in the plasma may move toward and adhere to a bevel surface and a backside of a peripheral portion of a target substrate. Accordingly, a deposit layer referred to as Bevel/Backside Polymer (BSP) is annularly formed at the peripheral portion of the target substrate. The BSP may have a bad influence on the semiconductor integrated circuits and, thus, is required to be removed. Japanese Patent Application Publication No. 2009-123831 and its corresponding U.S. Patent Application Publication No. 2009-0143894 disclose a technique for removing BSP by heat treatment using laser and ozone gas.

In the above-disclosed technique, spotted laser light is irradiated on a target substrate. Accordingly, the laser light is made to irradiate onto the BSP circumferentially formed at a peripheral portion of a target substrate while varying a laser irradiation position on the target substrate by rotating the target substrate.

However, when laser irradiation is performed while varying a laser irradiation position on the target substrate by relatively moving the target substrate and the laser, it takes long time to perform a BSP removing process and a throughput of the BSP removing process is low. Alternatively, it may be possible to rotate the wafer W at a high speed by using a high output laser to increase the throughput. In such a case, however, it is difficult to improve a throughput because it takes time to increase and decrease the rotation speed of the wafer W and, further, particles may be generated due to disturbance in the atmosphere caused by high rotation. Further, when the laser light is irradiated to the target substrate rotated at a high speed by using a high output laser, rapid heating and cooling may occur at the laser irradiation position, and thus peeling of BSP is easily generated by heat stress, thereby causing contamination of the target substrate.

SUMMARY OF THE INVENTION

In view of the above, the present invention provides a polymer removing apparatus and method capable of removing polymer annularly adhered to a peripheral portion of a target substrate with a high throughput while preventing generation of particles due to rotation of the target substrate and peeling of the polymers due to heat stress.

In accordance with an aspect of the present invention, there is provided a polymer removing apparatus for removing polymer annularly adhered to a peripheral portion of a target substrate, the apparatus including: a processing chamber for accommodating the target substrate having the polymer annularly adhered to the peripheral portion thereof; a mounting table for mounting the target substrate thereon; a laser irradiation unit for irradiating ring-shaped laser light at once to the whole polymer annularly adhered to the target substrate; an ozone gas supply unit for supplying an ozone gas to the polymer annularly adhered to the target substrate; and a gas exhaust unit for exhausting the ozone gas.

In accordance with another aspect of the present invention, there is provided a polymer removing method for removing polymer annularly adhered to a peripheral portion of a target substrate, the method including: mounting the target substrate having the polymer annularly adhered to the peripheral portion thereof on a mounting table; irradiating ring-shaped laser light at once to the whole polymer annularly adhered to the target substrate; and supplying an ozone gas to the polymer annularly adhered to the target substrate while the laser light is irradiated.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Hereinafter, embodiments of the present invention will be described with reference to the accompanying drawings which form a part hereof.

Figure 1:
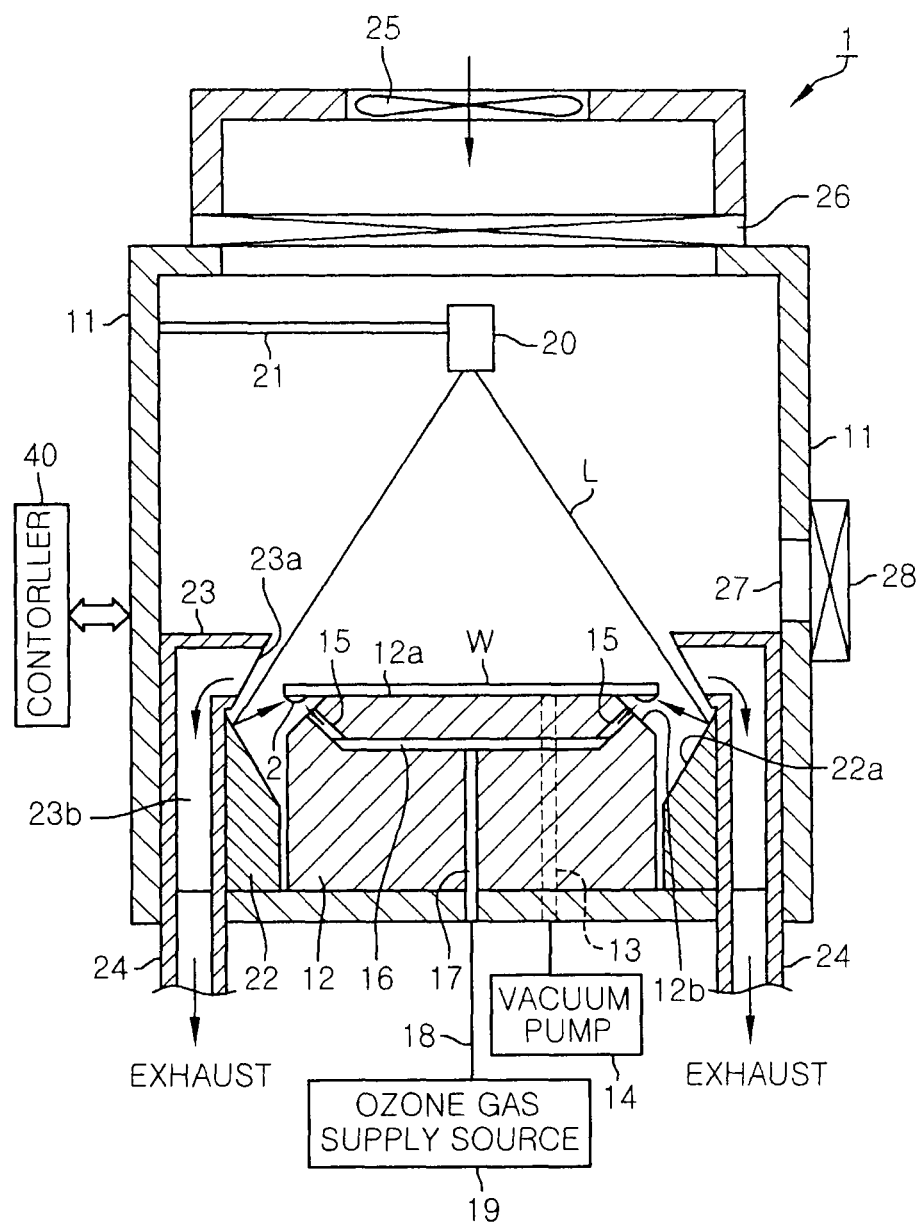
FIG. 1 is a cross sectional view showing a polymer removing apparatus in accordance with an embodiment of the present invention.

The polymer removing apparatus 1 in FIG. 1 includes a chamber 11 accommodating therein a semiconductor wafer W serving as a target substrate, the wafer W having a BSP 2 annularly (circumferentially) adhered to a peripheral portion thereof. A mounting table 12 having a substantially cylindrical shape, on which the wafer W is horizontally mounted, is provided at a bottom portion of the chamber 11. The mounting table 12 has a mounting surface 12a for mounting thereon a portion of the wafer W excluding its peripheral portion. The mounting table 12 has an adsorption opening 13 leading to the mounting surface 12a, and a vacuum pump 14 is connected to the adsorption opening 13. The wafer W is vacuum-adsorbed to the mounting surface 12a by operating the vacuum pump 14. That is, the mounting table 12 serves as a vacuum chuck.

A taper portion 12b is formed at an upper peripheral portion of the mounting table 12 corresponding to the peripheral portion of the wafer W. The taper portion 12b is provided with ozone gas injection openings 15 for discharging an ozone gas to the peripheral portion of the wafer W to which the BSP 2 adheres. The ozone gas injection openings 15 are arranged circumferentially about the common center. The ozone gas injection openings 15 are connected to a disc-shaped gas diffusion space 16 formed inside the mounting table 12. The gas diffusion space 16 is connected to a gas channel 17 extending from a bottom portion of the mounting table 12. The gas channel 17 is connected to a gas supply line 18, and the gas supply line 18 is connected to an ozone gas supply source 19 disposed outside the chamber 11. An ozone gas supplied from the ozone gas supply source 19 reaches the gas diffusion space 16 through the gas supply line 18 and the gas channel 17. The ozone gas is supplied from the gas diffusion space 16 to the peripheral portion of the wafer W with the BSP 2 adhered thereto through the ozone gas injection openings 15.

A laser irradiation head 20 serving as a laser irradiation unit to emit a ring-shaped laser light L is provided at a position corresponding to the center of the mounting table 12 at an upper portion of the chamber 11. The laser irradiation head 20 is supported by a supporting member 21 in the chamber 11.

Figure 2:
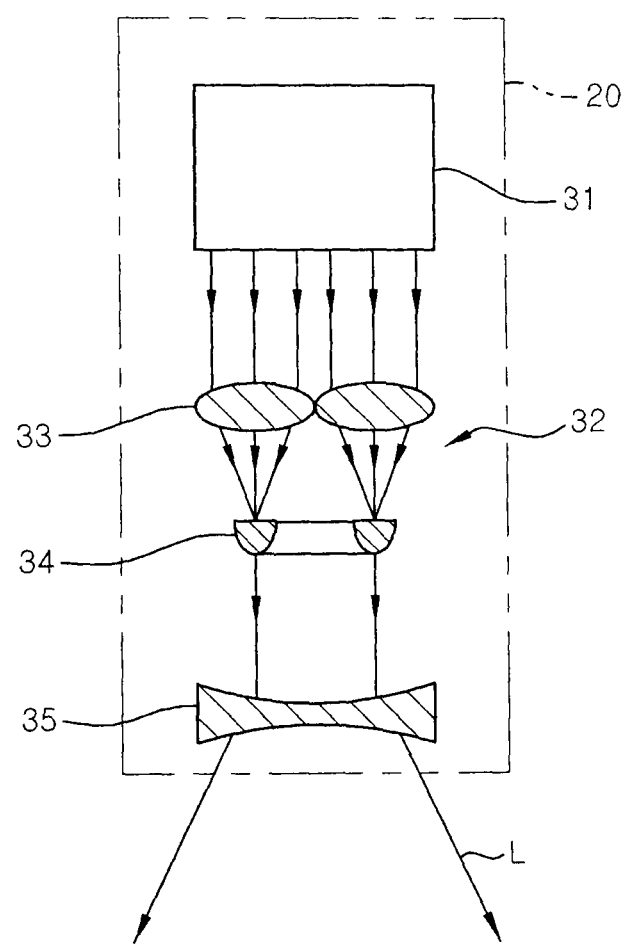
FIG. 2 illustrates a structure of a laser irradiation unit provided in the polymer removing apparatus shown in FIG. 1 to emit ring-shaped laser light.

The laser irradiation head 20 includes a laser light source 31 and an optical system 32 as shown in FIG. 2. The optical system 32 includes a curved surface lens 33 having the a cross section of a convex lens shape to annularly collect collimated light emitted from the laser light source 31, a ring-shaped cylindrical lens 34 for converting the annularly collected laser light into a ring-shaped collimated light, and a concave lens 35 for radially spreading the ring-shaped collimated light. A unit for irradiating the ring-shaped laser light is described, e.g., in FIG. 10 of Japanese Patent Application Publication No. 2006-229075.

The ring-shaped laser light L emitted from the laser irradiation head 20 is radially spread to pass through an area outside the peripheral portion of the wafer W. An irradiation position of the laser light emitted from the laser irradiation head 20 can be detected by using a CCD camera or a light sensor receiving reflection light. Further, a position of the laser irradiation head 20 can be adjusted such that the irradiation position can be adjusted based on the position detection information.

Further, a bowl-shaped cylindrical mirror member 22 having a mirror surface (reflection surface) 22a at an upper surface thereof is provided outside the mounting table 12 to surround the mounting table 12. The mirror member 22 functions as a reflection member for reflecting the laser light. Specifically, the mirror surface (reflection surface) 22a of the mirror member 22 reflects the ring-shaped laser light irradiated from the laser irradiation head 20 such that the reflected light is directed to the BSP 2 of the peripheral portion of the wafer W. Accordingly, the ring-shaped laser light L emitted from the laser irradiation head 20 is irradiated onto the whole BSP 2 of the peripheral portion of the wafer W at once via the mirror member 22.

A gas exhaust unit 23 for exhausting an ozone gas is provided outside the wafer W mounted on the mounting table and the mirror member 22 to surround them. The gas exhaust unit 23 includes a gas inlet port 23a formed circumferentially outside the wafer W and an annular gas exhaust path 23b through which an exhaust gas from the gas inlet port 23a is transferred to a bottom portion of the chamber 11. Further, at the bottom portion of the chamber 11, the gas exhaust path 23b is connected to gas exhaust lines 24. The gas exhaust lines 24 are connected to acid exhaust lines (not shown) of a factory such that, mainly, an ozone gas supplied to the peripheral portion of the wafer W is suction-exhausted by acid exhaust system (not shown) of the factory through the gas exhaust unit 23 and the gas exhaust lines 24.

Above the chamber 11, there are provided a fan 25 for introducing air into the chamber 11 by suction and a filter 26 for removing particles from the air suctioned by the fan 25. Accordingly, a downflow of clean air is formed in the chamber 11.

A wafer loading/unloading port 27 is provided at a sidewall of the chamber 11. The wafer loading/unloading port 27 can be opened and closed by a gate valve 28. For the loading/unloading of the wafer W, the gate valve 28 is opened and lifter pins (not shown), which are provided in the mounting table 12 to be protruded from and retracted into the mounting table 12, are protruded from the mounting table 12. Then, the wafer W is loaded to or unloaded from the lifter pins by a transfer arm (not shown).

The polymer removing apparatus 1 further includes a controller 40. The controller 40 has a microprocessor and mainly controls various parts of the polymer removing apparatus 1.

In the polymer removing apparatus having the above configuration, the gate valve 28 is opened first and the wafer W is loaded into the chamber 11 by the transfer arm through the wafer loading/unloading port 27 and is vacuum attracted to the mounting table 12. Then, the gate valve 28 is closed and the chamber 11 is airtightly sealed.

Thereafter, the ring-shaped laser light L is emitted from the laser irradiation head 20 and is reflected by the mirror surface (reflection surface) 22a of the mirror member 22. Accordingly, the whole BSP 2 of the peripheral portion of the wafer W is simultaneously irradiated by the ring-shaped laser light L. At the same time, an ozone gas is injected to the BSP 2 from the ozone gas injection openings 15. Consequently, the BSP 2 is removed by heat due to laser irradiation and oxidation due to the ozone gas. The supplied ozone gas is suction-exhausted by acid exhaust system (not shown) of the factory through the gas exhaust unit 23 and the gas exhaust lines 24. In this case, the position of the laser irradiation head 20 can be adjusted to irradiate the laser light to a desired position.

Conventionally, spotted laser light is irradiated on a target substrate. Accordingly, the laser light is made to irradiate onto the BSP circumferentially formed at a peripheral portion of a target substrate while varying a laser irradiation position on the wafer W by rotating the wafer W. In this case, since a laser spot area is small, the time required for a BSP removing process is lengthened and a throughput of the BSP removing process is low. Further, when the wafer W is rotated at a high speed by using a high output laser to increase the throughput, particles may be generated due to disturbance in the atmosphere caused by high rotation and peeling of the BSP may occur by heat stress due to rapid heating and cooling at the laser irradiation position.

On the contrary, in the present embodiment, the laser irradiation head 20 emits the ring-shaped laser light L, so that the laser light can be irradiated at once onto the whole BSP 2 circumferentially formed at the peripheral portion of the wafer W. Accordingly, it is possible to considerably increase a throughput compared to the conventional case of using the spotted laser light. Therefore, the laser light source 31 of the laser irradiation head 20 may have a low output level to gradually heat and cool an irradiation portion without reducing a throughput. Further, it is possible to decrease heat stress while securing a high throughput and prevent peeling of the BSP 2. Moreover, since there is no need to rotate the wafer W, disturbance in the atmosphere does not occur during the process, thereby suppressing particle generation.

Further, the ozone gas injection openings 15 are provided in a circumferential direction of the mounting table 12, and thus an ozone gas can be supplied from the ozone gas injection openings 15 to the whole BSP 2 circumferentially formed at the peripheral portion of the wafer W. Accordingly, the BSP 2 can be quickly removed by cooperation of the ring-shaped laser light and the ozone gas. Further, since the gas inlet port 23*a* of the gas exhaust unit 23 is formed circumferentially outside the wafer W, the ozone gas that has contributed to the BSP removal reaction can be efficiently exhausted via the gas exhaust unit 23.

Next, another embodiment of the present invention will be described.

When the ring-shaped laser light is irradiated to the peripheral portion of the wafer W, a temperature increase of the surface (device surface) of the wafer W may become problematic. This embodiment describes an example that can handle such problem.

Figure 3:
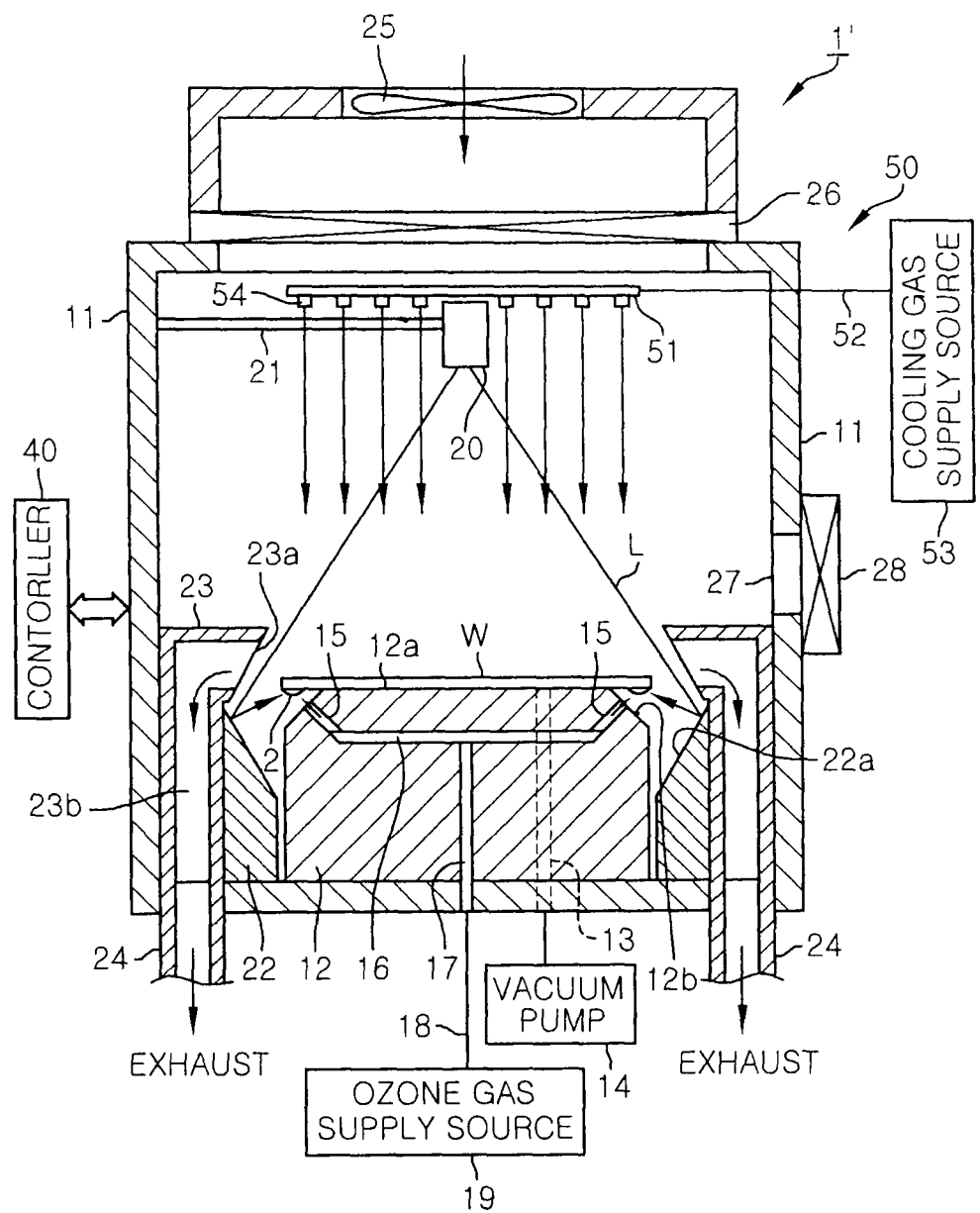
FIG. 3 illustrates a cross sectional view showing a polymer removing apparatus in accordance with another embodiment of the present invention.

FIG. 3 illustrates a cross sectional view showing a polymer removing apparatus in accordance with another embodiment of the present invention. A polymer removing apparatus 1' shown in FIG. 3 is configured such that a cooling unit is added to the polymer removing apparatus 1 of the FIG. 1. In FIG. 3, like reference numerals will be given to like parts as those of FIG. 1, and redundant description thereof will be omitted.

In the polymer removing apparatus 1', a wafer cooling unit 50 includes a cooling gas supply head 51 provided above the laser irradiation head 20 and a cooling gas supply source 53 connected to the cooling gas supply head 51 via a line 52 to supply a cooling gas. The cooling gas supply head 51 is provided with injection nozzles 54. The cooling gas supplied from the cooling gas supply source 53 to the cooling gas supply head 51 through the line 52 is injected to the wafer W through the injection nozzles 54. Accordingly, the surface of the wafer W is cooled to thereby avoid bad influence caused by the temperature increase of the device.

Figure 4:
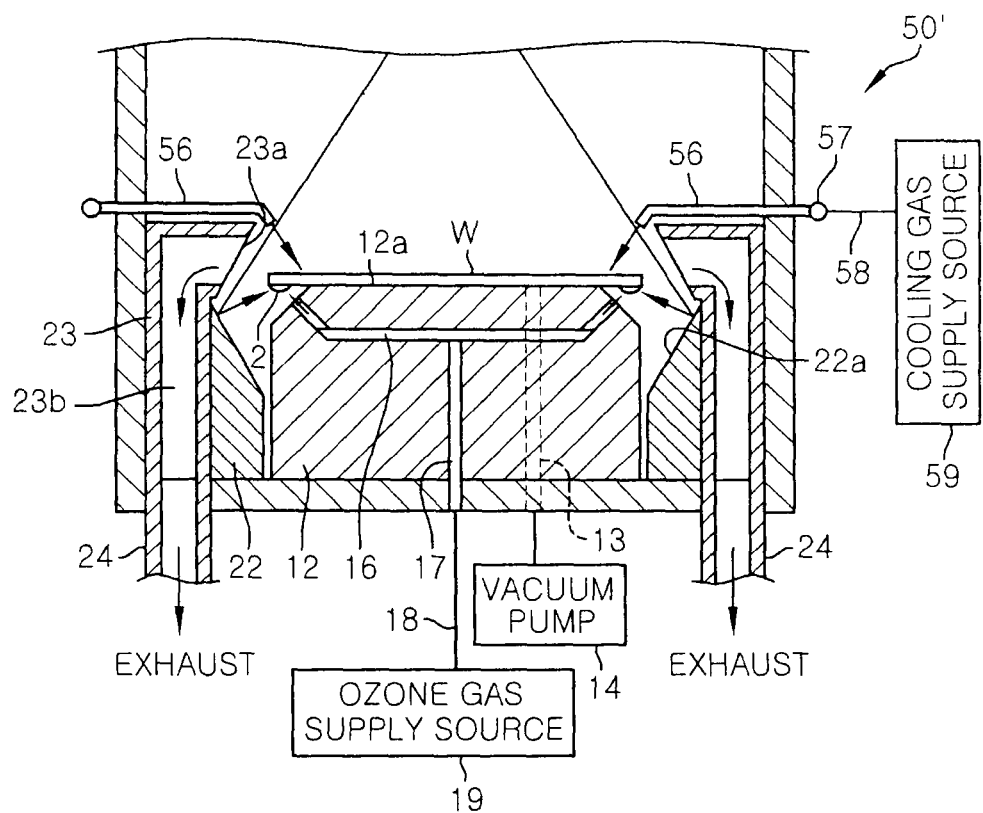
FIG. 4 is a cross sectional view showing a modification example of the polymer removing apparatus shown in FIG. 3.

FIG. 4 shows a modification example of the apparatus shown in FIG. 3, which includes a wafer cooling unit 50' having a configuration different from that of the cooling unit 50 shown in FIG. 3. The wafer cooling unit 50' includes injection nozzles 56 arranged above the gas exhaust unit 23 along the substantially cylindrical gas exhaust unit 23 to inject a cooling gas to the wafer W, a connection line 57 for connecting the ends of the injection nozzles 56 with one another, and a cooling gas supply source 59 connected to the connection line 57 via a line 58. The cooling gas supplied from the cooling gas supply source 59 through the line 58 and the connection line 57 is injected to the wafer W through the injection nozzles 56. In this manner, the surface of the wafer W can be also cooled.

Further, a clean cooling gas instead of the air by the fan 25 may be introduced. Accordingly, a downflow of cooling gas is formed in the chamber 11, thereby cooling the surface of the wafer W.

Further, the present invention may be variously modified without being limited to the above-described embodiments.

Figure 5:
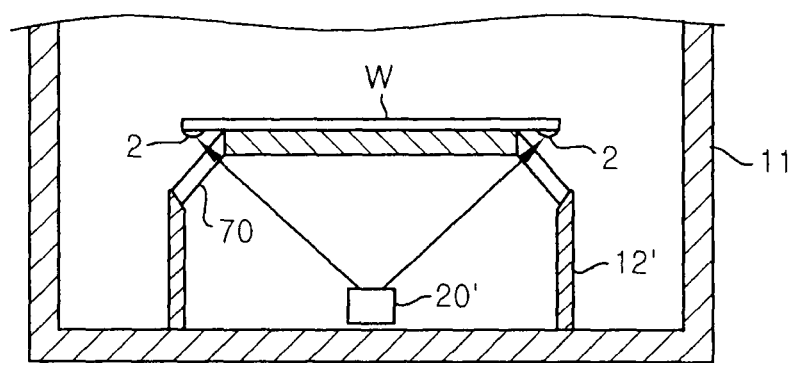
FIG. 5 is a cross sectional view for explaining another arrangement example of the laser irradiation unit.

For example, although the laser irradiation head (laser irradiation unit) is arranged above the wafer in the above embodiments, it is not limited thereto. For example, as shown in FIG. 5, a hollow mounting table 12' having a ring-shaped laser transmission window 70 at a position corresponding to the peripheral portion of the wafer W can be provided and a laser irradiation unit 20' is provided inside the mounting table 12', so that ring-shaped laser light can be irradiated onto the BSP 2 of the peripheral portion of the wafer W without using the mirror member (reflection member) 22. Although an ozone gas supply unit and a gas exhaust unit are not shown in FIG. 5 for simplicity, ozone gas injection nozzles arranged below and outside the circumferential BSP 2 may be used as the ozone gas supply unit, and the gas exhaust unit shown in FIG. 1 may be used.

Further, although the BSP removal is described in the above embodiments, the present invention can be applied to various cases for removing polymers formed at a peripheral portion of a target substrate. Further, although a semiconductor wafer is used as a target substrate in the above embodiments, other substrates may be used without being limited thereto.

In accordance with the embodiments of the present invention, ring-shaped laser light can be irradiated at once to whole polymer annularly adhered to a target substrate placed on the mounting table. Accordingly, it is possible to considerably increase a throughput compared to a conventional case of using a spotted laser light. Therefore, the laser light source of the laser irradiation unit may have a low output level to gradually heat and cool an irradiation portion without reducing a throughput. Further, it is possible to decrease heat stress while securing a high throughput and prevent peeling of the polymers. Moreover, since there is no need to rotate the target substrate, disturbance in the atmosphere does not occur during the process, thereby suppressing particle generation.

While the invention has been shown and described with respect to the embodiments, it will be understood by those skilled in the art that various changes and modifications may be made without departing from the scope of the invention as defined in the following claims.

What is claimed is:

1. A polymer removing apparatus, comprising:
   a processing chamber configured to accommodate a target substrate having polymer adhered to a peripheral portion thereof;
   a mounting table configured to mount the target substrate thereon;
   a laser irradiation unit configured to irradiate ring-shaped laser light at once to the polymer adhered to the peripheral portion of the target substrate;
   an ozone gas supply unit configured to supply an ozone gas to the polymer adhered to the peripheral portion of the target substrate; and
   a gas exhaust unit configured to exhaust the ozone gas,
   wherein the laser irradiation unit is provided above the target substrate,
   wherein the apparatus further comprises a reflection member configured to reflect the laser light emitted from the laser irradiation unit toward the polymer adhered to the peripheral portion of the target substrate, and
   wherein the reflection member has a cylindrical shape with a mirror surface at an upper surface thereof, and is positioned outside of the mounting table to surround the mounting table.

2. The polymer removing apparatus of claim 1, further comprising a cooling gas supply unit configured to supply a cooling gas to the target substrate.

3. A polymer removing method for removing polymer adhered to a peripheral portion of a target substrate, the method comprising: providing a polymer removing apparatus comprising:
   a processing chamber configured to accommodate a target substrate having polymer adhered to a peripheral portion thereof;
   a mounting table configured to mount the target substrate thereon;,
   a laser irradiation unit configured to irradiate ring-shaped laser light at once to the polymer adhered to the peripheral portion of the target substrate;
   an ozone gas supply unit configured to supply an ozone gas to the polymer adhered to the peripheral portion of the target substrate; and a gas exhaust unit configured to exhaust the ozone gas,
wherein the laser irradiation unit is provided above the target substrate,
wherein the apparatus further comprises a reflection member configured to reflect the laser light emitted from the laser irradiation unit toward the polymer adhered to the peripheral portion of the target substrate, and
wherein the reflection member has a cylindrical shape with a mirror surface at an upper surface thereof, and is positioned outside of the mounting table to surround the mounting table; the method further comprising:
mounting the target substrate having the polymer adhered to the peripheral portion thereof on the mounting table;
irradiating the ring-shaped laser light at once to the polymer adhered to the peripheral portion of the target substrate; and
supplying the ozone gas to the polymer adhered to the peripheral portion of the target substrate while the laser light is irradiated.

4. The polymer removing method of claim 3, further comprising supplying a cooling gas to the target substrate while the laser light is irradiated.

5. The polymer removing apparatus of claim 1, wherein the mirror surface has a bowl shape.

6. The polymer removing apparatus of claim 1, wherein the gas exhaust unit is provided outside of the reflection member and surrounds the reflection member.

7. The polymer removing apparatus of claim 6, wherein the gas exhaust unit includes a gas inlet port formed radially outside a circumference of the target substrate and an annular gas exhaust path through which an exhaust gas from the gas inlet port is transferred to a bottom portion of the processing chamber.

8. The polymer removing apparatus of claim 7, wherein the gas exhaust path is connected to gas exhaust lines.

9. The polymer removing apparatus of claim 1, wherein the ozone gas supply unit includes:
ozone gas injection openings configured to discharge the ozone gas;
a gas diffusion space formed inside the mounting table and connected to the ozone gas injection openings;
a gas channel connected to the gas diffusion space; and
a gas supply line connected to the gas channel.

10. The polymer removing apparatus of claim 9, wherein the ozone gas supply unit is provided at the mounting table.

11. The polymer removing apparatus of claim 2, wherein the cooling gas supply unit is positioned above the laser irradiation unit.

12. The polymer removing apparatus of claim 2, wherein the cooling gas supply unit is arranged above the gas exhaust unit and includes injection nozzles configured to inject the cooling gas.

13. The polymer removing apparatus of claim 1, wherein the laser irradiation unit is provided at a position corresponding to a center of the mounting table at an upper portion of the processing chamber.

14. The polymer removing apparatus of claim 1, wherein the apparatus further comprises a fan configured to introduce air into the processing chamber by suction, and a filter configured to remove particles from the air suctioned by the fan.

* * * * *